United States Patent
Carinci et al.

(10) Patent No.: US 11,988,732 B2
(45) Date of Patent: May 21, 2024

(54) METHOD FOR SIMULTANEOUS RECORDING OF SCAN DATA FROM AT LEAST TWO SLICES OF AN EXAMINATION OBJECT BY MEANS OF MAGNETIC RESONANCE

(71) Applicant: Siemens Healthcare GmbH, Erlangen (DE)

(72) Inventors: Flavio Carinci, Würzburg (DE); Mario Zeller, Erlangen (DE); Dominik Paul, Bubenreuth (DE)

(73) Assignee: Siemens Healthineers AG, Erlangen (DE)

( * ) Notice: Subject to any disclaimer, the term of this patent is extended or adjusted under 35 U.S.C. 154(b) by 119 days.

(21) Appl. No.: 17/708,138

(22) Filed: Mar. 30, 2022

(65) Prior Publication Data
US 2022/0317217 A1 Oct. 6, 2022

(30) Foreign Application Priority Data
Mar. 31, 2021 (DE) ...................... 10 2021 203 270.2

(51) Int. Cl.
*G01R 33/54* (2006.01)
*G01R 33/483* (2006.01)

(52) U.S. Cl.
CPC ....... *G01R 33/543* (2013.01); *G01R 33/4835* (2013.01)

(58) Field of Classification Search
None
See application file for complete search history.

(56) References Cited

U.S. PATENT DOCUMENTS

| | | | |
|---|---|---|---|
| 9,335,393 B2* | 5/2016 | Jin | G01R 33/54 |
| 2013/0230223 A1* | 9/2013 | Jellus | A61B 5/00 |
| | | | 324/309 |
| 2022/0317220 A1* | 10/2022 | Zeller | G01R 33/56518 |

FOREIGN PATENT DOCUMENTS

WO WO-2009036936 A1 * 3/2009 ......... G01R 33/4824

OTHER PUBLICATIONS

Setsompop, Kawin, et al.: "Blipped controlled aliasing in parallel imaging (blipped-CAIPI) for simultaneous multislice echo planar imaging with reduced g?factor penalty"; in: Magnetic Resonance in Medicine; vol. 67,5; pp. 1210-1224; 2012; DOI 10.1002/mrm. 23097; 2012.

Breuer, Felix A. et al.: "Controlled Aliasing in Parallel Imaging Results in Higher Acceleration (CAIPIRINHA) for Multi-Slice Imaging"; in: Magnetic Resonance in Medicine 53: S. 684-691 (2005); 2005.

(Continued)

*Primary Examiner* — Rodney E Fuller
(74) *Attorney, Agent, or Firm* — Banner & Witcoff Ltd.

(57) ABSTRACT

An improved technique for recording of scan data is provided, which includes recording scan data from at least two slices of an examination object simultaneously by means of a magnetic resonance system. The technique includes selecting a desired simultaneous recording of scan data from at least two slices (S1, . . . , Sn), determining an artifact-preventing minimum RF pulse duration (dRF) for a desired recording, considering desired recording parameters (PA), and performing the desired recording using the determined minimum RF pulse duration.

16 Claims, 2 Drawing Sheets

(56) References Cited

OTHER PUBLICATIONS

Figure 1:
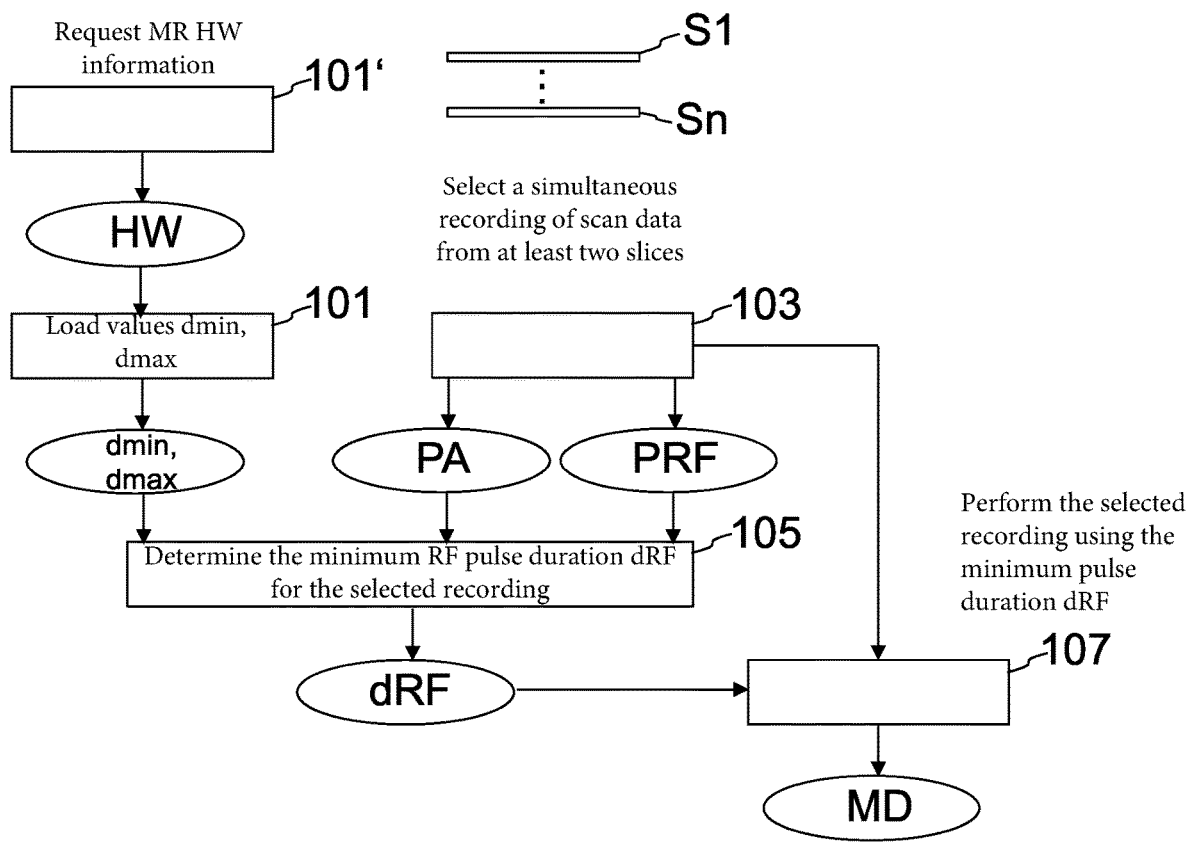

Setsompop, K. et al. "Improving diffusion MRI using simultaneous multi-slice echo planar imaging" NeuroImage, vol. 63, pp. 569-580, 2012 (Internet: The slice-GRAPPA algorithm (Setsompop et al., 2012) was used to unalias the multiple slices.); 2012.

Aigner, Christoph, S. et al: "Time optimal control-based RF pulse design under gradient imperfections"; Magnetic resonance in medicine,; 2020; 83. Jg.; Nr. 2; pp. 561-574.

\* cited by examiner

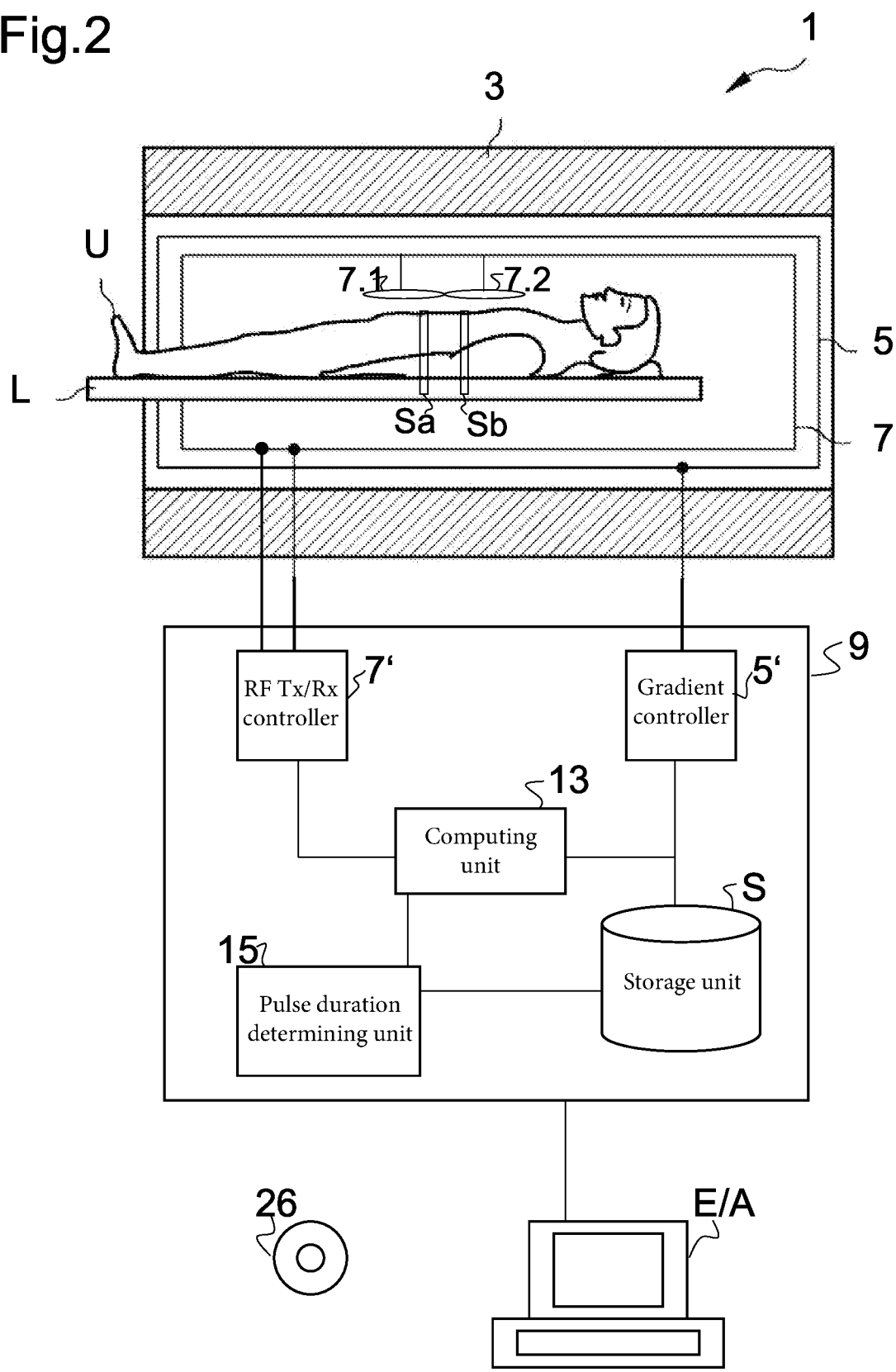

METHOD FOR SIMULTANEOUS RECORDING OF SCAN DATA FROM AT LEAST TWO SLICES OF AN EXAMINATION OBJECT BY MEANS OF MAGNETIC RESONANCE

CROSS-REFERENCE TO RELATED APPLICATIONS

The present application claims the benefit of the filing date of Germany patent application no. DE 10 2021 203 270.2, filed on Mar. 31, 2021, the contents of which are incorporated herein by reference in their entirety.

TECHNICAL FIELD

The disclosure relates to techniques for improved simultaneous recording of scan data from at least two slices of an examination object by means of magnetic resonance.

BACKGROUND

Magnetic resonance (MR) technology is a known technology with which images of the interior of an examination object can be generated. Expressed simply, for this purpose the examination object is positioned in a magnetic resonance device in a relatively strong, static, homogeneous main magnetic field, also known as the B0 field, with field strengths of 0.2 tesla to 7 tesla or more, so that its nuclear spins orient along the main magnetic field. In order to trigger nuclear spin resonances that are measurable as signals, radio-frequency excitation pulses (RF pulses) are radiated into the examination object and the nuclear spin resonances produced are measured as so-called k-space data and, on the basis thereof, MR images are reconstructed or spectroscopic data is determined. For position encoding of the scan data, rapidly switched magnetic gradient fields, known as "gradients" for short, are overlaid on the main magnetic field. A pattern that is used which defines a temporal sequence of RF pulses to be radiated in and gradients to be switched is known as a pulse sequence (scheme) or "sequence" for short. The recorded scan data is digitized and stored as complex number values in a k-space matrix. From the k-space matrix occupied with values, an associated MR image is reconstructable, for example by means of a multidimensional Fourier transform.

The method that is typically used to generate echo signals following an excitation of the nuclear spins is the so-called spin-echo method. In the simplest case, through irradiation of at least one RF refocusing pulse following the irradiation of the RF excitation pulse, the transverse magnetization is, so to speak, "turned" so that the dephased magnetization is rephased again and thus, following a time TE denoted as the echo time following the RF excitation pulse, a so-called spin echo SE is generated.

The excitation and measurement of the echo signals generated are repeated following a repetition time TR (for example by switching different gradients for position encoding) until the desired number of echo signals have been measured and stored in the k-space in order to be able to image the examination object.

Among the SE sequences, in particular the TSE ("turbo spin echo") sequences, which are also known by the names FSE ("fast spin echo") or RARE ("Rapid Acquisition with Refocused Echoes") sequences are widely used in clinical application. The advantage of the TSE sequences over the "simple" SE sequence is that following an RF excitation pulse, a plurality of refocusing pulses are switched and that thereby a plurality of spin echo signals SE are generated following an excitation. By this means, the data recording is accelerated, since fewer repetitions of the sequence with different position encoding are needed to measure all the desired data. The scan time for the entire k-space in TSE sequences is thereby reduced according to the number of the echo signals that are refocused and recorded following an excitation, according to the so-called "turbofactor", as compared with conventional SE methods.

SUMMARY

The desire for ever faster MR recordings in the clinical environment is currently leading to a resurgence of methods in which a plurality of images are recorded simultaneously. In general, these methods can be characterized in that during at least a part of the scan, transverse magnetization of at least two slices is used in a targeted manner simultaneously for the imaging process ("multi-slice imaging" or "slice multiplexing"). In contrast, in the established multi-slice imaging, the signal is recorded from at least two slices alternatingly, i.e. completely independently of one another with correspondingly long scan times.

Known methods for this are, for example, so-called Hadamard encoding, methods with simultaneous echo refocusing, methods with broadband data recording, or methods which use parallel imaging in the slice direction. The latter methods include, for example, the CAIPIRINHA technique as described by Breuer et al. in "Controlled Aliasing in Parallel Imaging Results in Higher Acceleration (CAIPIRINHA) for Multi-Slice Imaging", Magnetic Resonance in Medicine 53, 2005, pp. 684-691 and the blipped CAIPIRINHA technique as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp. 1210-1224.

In such slice multiplexing methods, a so-called multi-band RF pulse is used to excite two or more slices simultaneously or to otherwise manipulate them, for example to refocus or saturate them. Such a multi-band RF pulse is, for example, a multiplex of individual RF pulses which would be used for manipulation of the individual slices to be manipulated simultaneously. To be able to separate the resultant signals of the different slices, for example, a different phase is applied to each of the individual RF pulses before the multiplexing, for example by adding a linear phase increase, in each case, so that the slices are displaced relative to one another in the position space. By means of the multiplexing, for example, a baseband-modulated multi-band RF pulse is obtained from an addition of the pulse forms of the individual RF pulses.

As described, for example, in the aforementioned article by Setsompop et al., g-factor disadvantages can be reduced by displacements between the slices in that, for instance, gradient blips are used or the phases of the individual RF pulses are modulated accordingly. As also described in the aforementioned article by Setsompop et al., but also previously in the aforementioned article by Breuer et al., the signals of the simultaneously excited or otherwise manipulated slices can firstly be grouped together like signals from only one slice in order then to be separated in the subsequent processing by a parallel reconstruction method, for example a (slice-)GRAPPA method (GRAPPA: "GeneRalized Autocalibrating Partial Parallel Acquisition") or another parallel imaging method (PPA), for example, a SENSE method (SENSE: Sensitivity encoding).

For this type of separation of slices recorded in a collapsed manner, typically reference data recorded individually for each of the slices is used, which has been scanned, for example, in a prescan.

If a slice multiplexing method with the known gradient blips and, for example, a TSE sequence, is used, for recordings without suppression of spin signals from at least one tissue type, for example, in non-fat saturated recordings, ghosting artifacts can be observed in the resulting images.

It is an object of the disclosure to reduce artifacts in slice multiplexing methods.

The disclosure is based upon the discovery that ghosting artifacts can result from a different effect of the gradient blips used on spins in different tissue types. Due to a chemical shift, the aforementioned difference in the resonance frequencies of the spins present in different tissues, for example in water and fat tissue, the spins in the different tissue types are not excited in the same slice, but in slices displaced relative to one another by a slice spacing $\Delta z$, wherein:

$$\Delta z = c * B0 / A_{GS},$$

wherein c corresponds to the chemical shift of the bound spins observed in different tissue types, B0 is the strength of the main magnetic field and $A_{GS}$ is the strength (amplitude) of the slice selection gradients (GS) applied to the slice selection of the RF pulses used.

Gradient blips used in the slice direction thus also induce different phase shifts (also known as field of view (FOV) shifts) for spins bound in different tissue types. This phase shift is given as $\Upsilon * \Delta z * m_0$, wherein $m_0$ corresponds to the zeroth gradient moment of the gradient blip used and $\Upsilon$ is the gyromagnetic ratio. For example, in the blipped CAIPIRINHA technique mentioned above, the gradient moment $m_0$ changes from k-space line to k-space line along which scan data is recorded.

As a rule, the gradient blips are selected such that they evoke the desired phase shift for spins bound in water, so that, however, they evoke for example a different phase shift for spins bound in fat. As a result, artifacts, e.g. so-called fat ghosting artifacts, can be contained in the image data reconstructed from scan data recorded in this way.

The object of the present disclosure is achieved by a method for improved recording of scan data which can be recorded from at least two slices of an examination object simultaneously by means of the various embodiments as described herein, including the claims.

A method according to the disclosure for improved recording of scan data which can be recorded from at least two slices of an examination object simultaneously by means of a magnetic resonance system comprises the steps:
  selecting a desired simultaneous recording of scan data from at least two slices (S1, . . . , Sn),
  determining an artifact-preventing minimum RF pulse duration (dRF) for the desired recording, taking account of desired recording parameters (PA),
  carrying out (i.e. executing or otherwise performing) the desired recording using the determined minimum RF pulse duration.

With the method according to the disclosure, a minimum RF pulse duration is determined (automatically) considering the desired recording parameters and parameters inherent in the magnetic resonance system used, which can be used for a subsequent recording of scan data. Scan data recorded in this way is less influenced by the different phase shifts between spins bound in different tissue types, as described above, since the minimized RF pulse duration enables a maximization of the amplitude of the slice selection gradients used, so that displacements $\Delta z$ are reduced (see equation above). Thereby, image data reconstructed from scan data recorded according to the disclosure is less affected by artifacts than image data reconstructed from conventionally recorded scan data.

A magnetic resonance system according to the disclosure comprises a magnet unit, a gradient unit, a radio-frequency unit, and a control apparatus designed for carrying out a method according to the disclosure with a pulse duration determining unit.

A computer program according to the disclosure implements any of the methods according to the disclosure on a control apparatus, when it is executed on the control apparatus.

The computer program can herein also be present in the form of a computer program product, which can be directly loaded into a memory store of a control apparatus, having program code means in order to carry out (i.e. execute otherwise perform) any of the methods according to the disclosure when the computer program product is executed in the computing unit of the computing system.

An electronically readable data carrier according to the disclosure comprises electronically readable control information stored thereon, which comprises at least one computer program according to the disclosure and is configured such that, when the data carrier is used in a control apparatus of a magnetic resonance system, it carries out any of the methods according to the disclosure.

The advantages and embodiments set out in relation to any of the methods of the disclosure apply accordingly for the magnetic resonance system, the computer program product, and the electronically readable data carrier.

BRIEF DESCRIPTION OF THE DRAWINGS/FIGURES

Further advantages and details of the present disclosure are disclosed in the following description of exemplary embodiments and by reference to the drawings. The examples given do not represent restrictions of the disclosure. In the drawings:

FIG. 1 illustrates an example schematic flow diagram of a method according to one or more embodiments of the disclosure, FIG. 2 illustrates an example a schematically represented magnetic resonance system according to one or more embodiments of the disclosure.

DETAILED DESCRIPTION

FIG. 1 shows a schematic flow diagram of a method according to the disclosure for improved recording of scan data MD, which can be recorded simultaneously from at least two slices S1, Sn of an examination object by means of a magnetic resonance system.

Therein, values dependent upon a magnetic resonance system that is used can be loaded for a minimum RF pulse duration dmin and for a maximum RF pulse duration dmax (block 101). For this purpose, information relating to the hardware HW of the magnetic resonance system used can be requested (block 101').

A loaded minimum RF pulse duration dmin and a loaded maximum RF pulse duration dmax can be determined dependent upon applicable hardware-specific extreme values for parameters of the magnetic resonance system used.

For example, for the determination of the loaded minimum RF pulse duration dmin and the loaded maximum RF pulse duration dmax, extreme values of at least one of the parameters of the magnetic resonance system used from the group comprising a maximum RF transmitting power (B1max), a maximum gradient strength (Gmax) and a minimum slice thickness (thmin) can be considered.

For instance, a loaded minimum RF pulse duration dmin can be determined as a function F1 of the inverse values of the maximum gradient strength Gmax and the maximum RF transmitting power B1max, where dmin=F1(1/B1max, 1/Gmax) applies. A procedure of this type reflects that shorter RF pulse durations require higher RF transmitting power levels and higher gradient strengths.

A maximum RF pulse duration dmax can be determined, for example, as a function F2 of the maximum gradient strength Gmax and the inverse minimum slice thickness thmin, where dmax=F2(1/thmin, Gmax) applies. A procedure of this type reflects that longer RF pulse durations increase an achievable minimum slice thickness, but reduce a required gradient strength.

Herein, the values of the loaded minimum and maximum RF pulse duration dmin and dmax can be adopted, for example, from manufacturer specifications of the magnetic resonance system, or determined uniquely for a specific magnetic resonance system. However, it is also conceivable to determine the values for the minimum and maximum RF pulse duration dmin and dmax of a magnetic resonance system before carrying out a recording of scan data, at least in predetermined time intervals, always or anew after a corresponding user input, whereby possibly occurring changes to the extreme values can be considered.

A desired simultaneously recording of scan data from at least two slices S1, Sn of, for example, a total of N slices to be recorded N (N≥n) of the examination object, is selected (block 103). By way of the selection of the desired recording, associated recording parameters PA and possible RF pulses usable in the desired recording are also stipulated together with their associated RF parameters PRF.

As a desired recording, for example a simultaneous recording of n slices by means of a slice multiplexing method, e.g. using gradient blips for impressing a phase difference, for example, a blipped CAIPIRINHA method can be selected.

The minimum RF pulse duration can herein be determined for a multi-band RF pulse and/or for a VERSE (Variable Rate Selective Excitation) pulse if the desired recording permits. Multi-band RF pulses are readily used as described above for slice multiplexing methods. VERSE pulses can advantageously also be used, due to their inherently low required RF transmitting power levels. This is because, due to the fundamentally lower RF transmitting power levels required as compared with other RF pulses, an achievable minimum RF pulse duration can be reduced further than is the case with other RF pulses and/or an achievable minimum slice thickness smaller than with other RF pulses can be achieved.

Taking account of desired recording parameters PA, a minimum artifact-reducing RF pulse duration $d_{RF}$ is determined for the desired recording (block 105).

Advantageously, in the determination of the minimum RF pulse duration $d_{RF}$, loaded values of the minimum and maximum RF pulse duration dmin and dmax for the magnetic resonance system used are also considered. For instance, it can be required that a determined minimum RF pulse duration $d_{RF}$ lies in a region delimited by the loaded minimum RF pulse duration dmin and the loaded maximum RF pulse duration dmax. In this way, it is ensured that the determined minimum RF pulse duration is achievable with the magnetic resonance system.

A desired recording parameter PA considered in the determination of the minimum RF pulse duration $d_{RF}$ can be a recording parameter PA from the group comprising a desired slice thickness ths1 and an intended gradient strength G. In this way, it can be ensured for example, that no (excessive) deviation from the desired slice thickness takes place.

In the determination of the minimum RF pulse duration $d_{RF}$, at least one characteristic RF pulse parameter PRF for an RF pulse to be used, the minimum RF pulse duration of which is determined, such as for example, a bandwidth and/or a pulse shape of the RF pulse can be considered. The minimizing can thus be carried out in a pulse-specific manner.

A determination of the minimum RF pulse duration $d_{RF}$ can comprise a use of a relationship between desired recording parameters and an achievable RF pulse duration. If such a relationship between desired recording parameters and an achievable RF pulse duration is known, this can be used to determine the minimum RF pulse duration.

For example, a minimum RF pulse duration $d_{RF}$ can be determined as a function F3 dependent upon a desired slice thickness ths1 and a gradient strength G that is provided, as follows:

$$d_{RF}=F3(\Upsilon/(ths1*G)),$$

where $\Upsilon/(ths1*G)$ reflects a relationship between the desired recording parameters and the RF pulse duration, and the function F3 can further depend upon at least one RF pulse parameter, for example, the selected pulse shape.

In order to ensure, as mentioned above, that the determined minimum RF pulse duration $d_{RF}$ lies within the loaded values of minimum and maximum RF pulse durations dmin and dmax for a magnetic resonance system, the determination can further comprise a maximum function that reflects the largest of the elements input to it and a minimum function which reflects the smallest of the elements input into it.

For example, a minimum RF pulse duration $d_{RF}$ with the minimum RF pulse duration dmin initially determined, for example, by means of a function F3 can be subjected to a maximum function to obtain as the result a first tested minimum RF pulse duration, $d_{RF}1=\max(d_{RF}, dmin)$.

The first tested minimum RF pulse duration $d_{RF}1$ can be subjected with the maximum RF pulse duration dmax to a minimum function in order to obtain as the result a finally tested minimum RF pulse duration, $d_{RF}2=\min(d_{RF}1, dmax)$ as the final result of the determination of the minimum RF pulse duration.

The desired recording is carried out (i.e. executed or otherwise performed) using the determined minimum RF pulse duration $d_{RF}$ (block 107) in order to obtain the desired scan data. The use of the minimum pulse duration DRF according to the disclosure, a displacement in the slice direction of spins bound in different tissue types is adjusted, so that artifacts, in particular artifacts caused by a chemical shift, are reduced.

FIG. 2 shows schematically a magnetic resonance system 1 according to the disclosure.

This system comprises a magnet unit 3 (e.g. a main magnet) for generating the main magnetic field, a gradient unit (e.g. gradient generation circuitry) 5 for generating the gradient fields, a radio-frequency unit (e.g. an RF signal circuitry, which may be referred to herein as an RF transmitter, receiver, or transceiver) 7 for radiating in and receiving radio-frequency signals, and a control apparatus (e.g. control circuitry) 9 configured for carrying out (i.e. executing or otherwise performing) any of the methods according to the disclosure.

In FIG. 2, these subunits of the magnetic resonance system 1 are shown only roughly schematically. In particular, the radio-frequency unit 7 can consist of a plurality of subunits, for example, a plurality of coils such as the schematically shown coils 7.1 and 7.2 or more coils, which can be configured either only to transmit radio-frequency signals (e.g. when implemented or otherwise configured as an RF transmitter) or only to receive the triggered radio-frequency signals (e.g. when implemented or otherwise configured as an RF receiver), or for both (e.g. when implemented or otherwise configured as an RF transceiver).

In order to examine an examination object U, for example, a patient or a phantom, the object U may be introduced on a support L into the magnetic resonance system 1, in the scanning volume thereof. The slices Sa and Sb represent slices of the examination object that are to be recorded simultaneously in the example and from which echo signals are to be recorded and captured as scan data.

The control apparatus 9 (e.g. a computing device, one or more processors, processing circuitry, a controller, computer, etc.) serves to control the magnetic resonance system 1 and may e.g. control the gradient unit 5 by means of a gradient controller (e.g. gradient controller circuitry) 5' and the radio-frequency unit 7 by means of a radio-frequency transmitting/receiving controller (e.g. RF controller circuitry) 7'. The radio-frequency unit 7 can herein comprise a plurality of channels on which signals can be transmitted or received.

The radio-frequency unit 7 is configured, together with its radio-frequency transmitting/receiving controller 7', to generate and radiate-in (e.g. transmit) a radio-frequency alternating field for manipulation of the spins in a region to be manipulated (for example, in slices S to be scanned) of the examination object U. Herein, the center frequency of the radio-frequency alternating field, also designated the B1 field, is typically adjusted so that, as far as possible, it lies close to the resonance frequency of the spin to be manipulated. Deviations of the center frequency from the resonance frequency are referred to as off-resonance. In order to generate the B1 field, in the radio-frequency unit 7, currents controlled by means of the radio-frequency transmitting/receiving controller 7' are applied to the RF coils.

Furthermore, the control apparatus 9 comprises a pulse duration determining unit (e.g. pulse duration determination circuitry) 15 with which minimum RF pulse durations can be determined. The control apparatus 9 is configured overall to carry out a method according to the disclosure.

A computing unit (e.g. also referred to herein as a computing device, computer, controller, computing circuitry, etc.) 13 included in the control apparatus 9 is configured to carry out all the computation operations necessary for the required scans and determinations. Intermediate results and results needed for this or determined herein can be stored in a storage unit (e.g. volatile and/or non-volatile memory) S of the control apparatus 9. The units shown are herein not necessarily to be understood as physically separate units, but represent merely a subdivision into units of purpose which, however, can also be implemented, for example, in fewer, alternate, or even only in one single, physical unit.

By means of an input/output apparatus (E/A or I/O) of the magnetic resonance system 1, for example, control commands can be passed by a user to the magnetic resonance system and/or results from the control apparatus 9 such as, for example, image data can be displayed via a suitable display device, which may be part of the input/output apparatus.

A method described herein may also be implemented in the form of a computer program product, which comprises a program and implements the described method on a control apparatus 9 when said program is executed on the control apparatus 9. An electronically readable data carrier 26 with electronically readable control information stored thereon can also be provided, said control information comprising at least one computer program product as described above and being configured to carry out any of the methods described when the data carrier 26 is used in a control apparatus 9 of a magnetic resonance system 1.

The various components described herein may be referred to as "units." As noted above, such components may be implemented via any suitable combination of hardware and/or software components as applicable and/or known to achieve the intended respective functionality. This may include mechanical and/or electrical components, FPGAs, processors, processing circuitry, or other suitable hardware components configured to execute instructions or computer programs that are stored on a suitable computer readable medium. Regardless of the particular implementation, such units, as applicable and relevant, may alternatively be referred to herein as "circuitry," "processors," or "processing circuitry."

What is claimed is:

1. A method for recording scan data simultaneously from at least two slices of an examination object via a magnetic resonance system, comprising:
   selecting a simultaneous recording of scan data from the at least two slices;
   determining an artifact-preventing radio frequency (RF) pulse duration for the selected simultaneous recording of the scan data based upon one or more recording parameters; and
   executing the selected simultaneous recording of the scan data using the determined artifact-preventing RF pulse duration,
   wherein the artifact-preventing RF pulse duration is determined for a multi-band RF pulse.

2. The method of claim 1, wherein the artifact-preventing RF pulse duration is a minimum RF pulse duration that is determined based upon the one or more recording parameters.

3. The method as claimed in claim 2, wherein the determination of the artifact-preventing RF pulse duration is based upon values for the minimum RF pulse duration and a maximum RF pulse duration.

4. The method as claimed in claim 3, wherein the minimum RF pulse duration and the maximum RF pulse duration are determined based upon extreme values of at least one of the recording parameters of the magnetic resonance system.

5. The method as claimed in claim 4, wherein the extreme values of at least one of the recording parameters of the magnetic resonance system include at least one of a maximum RF transmitting power, a maximum gradient strength, and a minimum slice thickness.

6. The method as claimed in claim 3, wherein the determined artifact-preventing RF pulse duration occupies a region that is delimited by the minimum RF pulse duration and the maximum RF pulse duration.

7. The method as claimed in claim 1, wherein the artifact-preventing RF pulse duration is determined for a Variable Rate Selective Excitation (VERSE) pulse.

8. The method as claimed in claim 1, wherein the artifact-preventing RF pulse duration is determined based upon a recording parameter including at least one of a slice thickness and a gradient strength.

9. The method as claimed in claim 1, wherein the artifact-preventing RF pulse duration is determined based upon a bandwidth and/or a pulse shape of an RF pulse to be used.

10. The method as claimed in claim 1, wherein the artifact-preventing RF pulse duration is determined based upon a relationship between the one or more recording parameters and an RF pulse duration that is achievable via the magnetic resonance system.

11. The method of claim 1, wherein the executing the selected simultaneous recording of the scan data comprises executing the selected simultaneous recording of the scan data as part of a slice multiplexing technique in which the multi-band RF pulse is used to simultaneously excite the at least two slices of the examination object.

12. The method of claim 1, wherein the multi-band RF pulse comprises a multiplex of individual RF pulses, the individual RF pulses being used to respectively excite the at least two slices of the examination object simultaneously.

13. The method of claim 12, wherein the multi-band RF pulse is generated by applying a different phase to each of the individual RF pulses before being multiplexed to form the multi-band RF pulse.

14. The method of claim 1, wherein the multi-band RF pulse comprises a baseband-modulated multi-band RF pulse that is obtained from an addition of pulse forms of at least two individual RF pulses.

15. A magnetic resonance system for recording scan data simultaneously from at least two slices of an examination object via a magnetic resonance system, comprising:
a main magnet; and
control circuitry configured to:
select a simultaneous recording of scan data from the at least two slices;
determine an artifact-preventing radio frequency (RF) pulse duration for the selected simultaneous recording of the scan data based upon one or more recording parameters; and
execute the selected simultaneous recording of the scan data using the determined artifact-preventing RF pulse duration,
wherein the artifact-preventing RF pulse duration is determined for a multi-band RF pulse.

16. A non-transitory computer-readable medium having information stored thereon that, when executed by control circuitry of a magnetic resonance system, cause the magnetic resonance system to record scan data simultaneously from at least two slices of an examination object via a magnetic resonance system by:
selecting a simultaneous recording of scan data from the at least two slices;
determining an artifact-preventing radio frequency (RF) pulse duration for the selected simultaneous recording of the scan data based upon one or more recording parameters; and
executing the selected simultaneous recording of the scan data using the determined artifact-preventing RF pulse duration,
wherein the artifact-preventing RF pulse duration is determined for a multi-band RF pulse.

* * * * *